(12) United States Patent
Vimercati et al.

(10) Patent No.: US 7,521,989 B2
(45) Date of Patent: Apr. 21, 2009

(54) DISTRIBUTION OF AN ELECTRIC QUANTITY THROUGH A CIRCUIT

(76) Inventors: Daniele Vimercati, Via M.L. King, 10, Carate Brianza (IT) 20048; Osama Khouri, Via Vespri Siciliani, 1, Milano (IT) 20146; Sara Fiorina, Via Ronchetti, 2, Nembro (IT) 24027

( * ) Notice: Subject to any disclaimer, the term of this patent is extended or adjusted under 35 U.S.C. 154(b) by 461 days.

(21) Appl. No.: 11/185,905

(22) Filed: Jul. 20, 2005

(65) Prior Publication Data

US 2006/0018067 A1 Jan. 26, 2006

(30) Foreign Application Priority Data

Jul. 21, 2004 (EP) .................................. 04103488

(51) Int. Cl.
*G05F 3/02* (2006.01)
(52) U.S. Cl. .................... 327/538; 327/540; 327/541
(58) Field of Classification Search ................ 327/538, 327/541, 539, 540
See application file for complete search history.

(56) References Cited

U.S. PATENT DOCUMENTS

| | | | | |
|---|---|---|---|---|
| 4,994,688 A | * | 2/1991 | Horiguchi et al. ........... 327/541 |
| 5,844,434 A | * | 12/1998 | Eschauzier ................... 327/143 |
| 5,872,737 A | | 2/1999 | Tsuruda et al. ......... 365/189.05 |
| 6,525,598 B1 | * | 2/2003 | Croman ....................... 327/543 |
| 6,781,443 B2 | * | 8/2004 | Hamamoto et al. .......... 327/541 |
| 6,844,773 B2 | * | 1/2005 | Ishida et al. ................. 327/543 |
| 6,906,583 B1 | * | 6/2005 | Aude ........................... 327/543 |
| 2001/0009382 A1 | | 7/2001 | DeSoto et al. ............... 326/106 |
| 2003/0189869 A1 | | 10/2003 | Yamagata et al. ............ 365/226 |

* cited by examiner

*Primary Examiner*—Kenneth B. Wells
(74) *Attorney, Agent, or Firm*—Blakely, Sokoloff, Taylor & Zafman LLP

(57) ABSTRACT

A method of distributing an electric quantity through an electronic circuit for local exploitation by at least one circuit block of the electronic circuit that includes providing in the electronic circuit first and second conductive lines, the first conductive line distributing a first electric potential and the second conductive line carrying a second electric potential that is a dedicated reference electric potential for the first electric potential, the first and second electric potentials corresponding to the distributed electric quantity, and locally exploiting the distributed electric quantity by at least one circuit block of the electronic circuit, by locally reconstructing the distributed electric quantity from the first and second electric potentials without perturbing them, particularly without either sinking or injecting any significant current from or into the first and second conductive lines.

17 Claims, 5 Drawing Sheets

DISTRIBUTION OF AN ELECTRIC QUANTITY THROUGH A CIRCUIT

BACKGROUND OF THE INVENTION

1. Field of the Invention

The present invention relates in general to electronic circuits, particularly to Integrated Circuits (ICs). More specifically, the invention relates to the aspects of distributing electric quantities through an electronic circuit for local use, e.g., for use by circuit blocks as reference signals, such as reference voltages or currents.

2. Description of the Related Art

In electronic circuits, particularly in ICs, there is often the necessity of distributing through the IC electric quantities, such as voltages and/or currents, that are for example generated centrally, in a localized region of the IC, and which are exploited, e.g., as reference signals, locally to one or more circuit blocks in the IC, which are located more or less remotely from the generation site.

One example is the case of semiconductor memories. Some kinds of semiconductor memories, e.g., non-volatile memories such as ROMs, EPROMs, EEPROMs, and Flash memories, make use of reference voltages or currents or both for the operation of reading the data stored in the memory cells. Additionally, those non-volatile memories that are also electrically programmable use reference voltages or currents or both for the operation of verifying the data programmed into the memory cells.

These are mere examples, and the list of situations wherein reference electric quantities need to be generated and distributed through an electronic circuit, such as an IC, is very long.

The distribution of the reference voltages and currents is a critical aspect, especially in case of ICs of large size, which is more and more frequent, in consideration of the trend towards the increase of the integration scale.

For example, a reference voltage signal, which may be used by a circuit as such, or exploited for generating, by conversion, a reference current signal, is typically distributed through the IC by means of a metal line (for simplicity, a "metal").

According to a first known solution, schematically depicted in FIG. 1, wherein reference numeral 100 is intended to identify a generic IC, e.g., a semiconductor memory such as a Flash memory, including a generator 105 of a reference voltage signal, the reference voltage, which is generated and distributed by means of a metal Vr, through the IC, is referred to an IC common reference electric potential, such as the common ground voltage, which is distributed through the IC by means of a metal GND (the common ground voltage typically is the electric potential to which the IC supply voltage VDD, distributed through the chip by means of a metal VDD, is referred); in this case, only one metal (the metal Vr) needs to be routed through the IC for distributing the reference voltage signal, from the generation site (i.e., the site in the IC where the reference voltage signal generator 105 is integrated) to the site or sites where the reference voltage is exploited, e.g., the circuit blocks 110a and 110b; for example, in case the IC is a non-volatile, electrically programmable memory, the circuit blocks 110a and 110b may be sense amplifier circuits or programming circuits, for sensing or programming the memory cells.

Due to the non-zero resistivity of the metals, currents injected into the common ground metal GND by the several circuit blocks of the IC, including currents I0 and I1 injected by the circuit blocks 110a and 110b exploiting the reference voltage signal (so-called self-induced disturbs), and currents injected into the common ground metal GND by any other circuit block of the IC, such as the current I2 injected by the circuit block 115 can disturb the value of the intended current or voltage or both. Any such current contributes to making the actual, local value of the common ground electric potential vary along the common ground metal GND. As a consequence, the actual value Vrif,a, Vrif,b of the reference voltage signal locally, at the circuit blocks 110a and 110b, differs from the reference voltage signal nominal value Vrif at the generation site. Such an effect can be reduced by properly dimensioning the IC metals, particularly by providing a relatively wide common ground metal GND, so as to reduce their resistivity, but there are semiconductor area and layout constraints to be respected that limit the possibility of widening the metal lines. Other sources of noise that may affect the actual local value of the reference voltage signal are for example fast switching digital signals, such as clock signals CLK, that, due to capacitive coupling, affect the local value of the common ground voltage, and thus the local actual value of the reference voltage signal.

In an alternative solution, schematically depicted in FIG. 2, yet at the generation site, the reference voltage signal may be referred to a dedicated reference electric potential, which is thus distributed through the IC alongside with the reference voltage signal by means of a dedicated reference electric potential metal GNDr, physically distinct from the metal GND that distributes, through the IC, the common ground. In this case, two metals are necessary for distributing the reference voltage signal from the generation site to the site of exploitation: one metal Vr for the reference voltage, and another metal GNDr for the dedicated reference electric potential, are in fact necessary for routing the reference voltage from the generation site to the site of exploitation (where the circuit blocks 110a, . . . , 110k are located). In this way, disturbances induced by currents injected into the common ground metal GND by circuit blocks (e.g., the circuit block 115) other than those exploiting the reference voltage are avoided, but the above-mentioned self-induced disturbances are still present. Additionally, while in an IC it is normally feasible to have a large metal GND for distributing the IC common ground potential, this is not the case for any dedicated reference potential metals GNDr, for which the area requirements are much stricter, and which are thus normally kept narrow.

In any case, the problem of having a reference electric quantity that, when distributed to different sites of the electronic circuit, changes its values with respect to the expected, nominal value, is a great problem in several applications.

Just to cite an example, let the case of a multi-level non-volatile semiconductor memory be considered, for example a multi-level Flash memory. In such a memory, each memory cell is adapted to store more than one bit of information, for example two bits, usually in terms of a plurality of (e.g., four or more) different values of the threshold voltage of a MOS transistor. The distance between the different threshold voltage values is small. In terms of current sunk by the memory cell, the memory cell currents that correspond to different threshold voltage values may differ from each other of a few microamperes. Thus, it is essential that the reference voltage(s) used to discriminate between the different threshold voltage values (or, dually, the reference current(s) used to discriminate between the different currents that may be sunk by the memory cell, depending on its programming state) is very precise. This is hardly achieved due to the disuniformity of the distributed reference voltage signal through the IC.

In view of the state of the art outlined in the foregoing, the Applicant has faced the problem of how to ensure that an electric quantity, such as a reference voltage/current signal, that has to be distributed through an electronic circuit, e.g., an IC, has, at a generic exploitation site in the IC, a value that substantially does not differ from the expected, nominal value, and that the value of such a distributed electric quantity is substantially uniform at different exploitation sites in the electronic circuit.

BRIEF SUMMARY OF THE INVENTION

According to one embodiment of the present invention, there is provided a method of distributing an electric quantity through an electronic circuit for local exploitation by at least one circuit block of the electronic circuit. The method includes:

distributing through the electronic circuit a first and second conductive lines, the first conductive line distributing a first electric potential and the second line carrying a second electric potential being a dedicated reference electric potential for the first electric potential, the first and second electric potentials corresponding to the distributed electric quantity, and locally exploiting the distributed electric quantity by at least one circuit block of the electronic circuit.

Locally exploiting includes reconstructing the distributed electric quantity from the first and second electric potentials without perturbing them, in particular without either sinking or injecting any significant current from or into the first and second conductive lines.

In particular, the locally exploiting includes electrically connecting the at least one circuit block to the first and second conductive lines through an input interface having high input impedance.

The input interface includes first and a second inputs, respectively connected to the first and second conductive lines, the first and second inputs being high-impedance inputs.

In an embodiment of the invention, the first and second inputs are control inputs of transistors, particularly transistors having an insulated control electrode, for example MOSFETs.

The method may further include:

at a first location of the electronic circuit, generating an electric current signal corresponding to the electric quantity to be distributed, using a third conductive line, distributing the electric current through the electronic circuit to a second location thereof, in a region of the electronic circuit wherein the at least one circuit block is located, and at the second location, obtaining from the electric current signal the electric quantity to be distributed.

According to another aspect of the invention, an electric quantity distribution arrangement is provided for distributing an electric quantity through an electronic circuit for local exploitation by at least one circuit block of the electronic circuit. The distribution arrangement includes first and a second conductive lines, the first conductive line distributing a first electric potential and the second line carrying a second electric potential that is a dedicated reference electric potential for the first electric potential, the first and second electric potentials corresponding the distributed electric quantity.

The at least one circuit block has an input interface by which it is electrically connected to the first and second conductive lines, the input interface being such as to not perturb the first and second electric potentials, in particular such as to neither sink nor inject any significant current from or into the first and second conductive lines.

In particular, the input interface may include first and a second inputs, respectively connected to the first and second conductive lines, the first and second inputs being high-impedance inputs.

Ideally, the first and second inputs are control inputs of transistors, particularly transistors having an insulated control electrode, for example MOSFETs.

In accordance with another embodiment of the invention, an electronic circuit is provided that includes first and second dedicated reference potential lines structured to carry an electric potential, and at least one circuit block having an input interface coupled to the first and second reference potential lines for receiving the electric potential, the input interface structured to present a substantially infinite input resistance so that no electric current is sunk at the input interface and no electric current is injected at the input interface.

In accordance with another embodiment of the invention, an electronic circuit is provided that includes a voltage generator that generates a bandgap reference voltage; a circuit for converting the bandgap reference voltage into a reference current; a distribution line coupled to the converting circuit to distribute the reference current; a circuit for reconversion of the reference current into a reference voltage; first and second dedicated reference potential lines coupled to the reconversion circuit to distribute the reference voltage; and at least one circuit block having an input interface coupled to the first and second dedicated reference potential lines, the input interface structured to present a substantially infinite input resistance so that the reference voltage on the first and second dedicated reference potential lines is not perturbed.

In accordance with yet another embodiment of the invention, a method of distributing electric voltage in a circuit is provided, the method including generating an electric reference voltage; converting the electric reference voltage into a reference current; distributing the reference current in the circuit; receiving the reference current at a conversion circuit; converting the reference current to the electric reference voltage in the conversion circuit; and distributing the electric reference voltage via first and second dedicated reference potential lines to local circuit blocks having input interfaces that present a substantially infinite input resistance so that no electric current is sunk at the input interface and no electric current is injected at the input interface.

BRIEF DESCRIPTION OF THE SEVERAL VIEWS OF THE DRAWINGS

The features and advantages of the present invention will be made apparent by the following detailed description of some embodiments thereof, provided merely by way of non-limitative examples, a description that will be conducted making reference to the attached drawings, wherein.

DETAILED DESCRIPTION OF THE INVENTION

Figure 3:
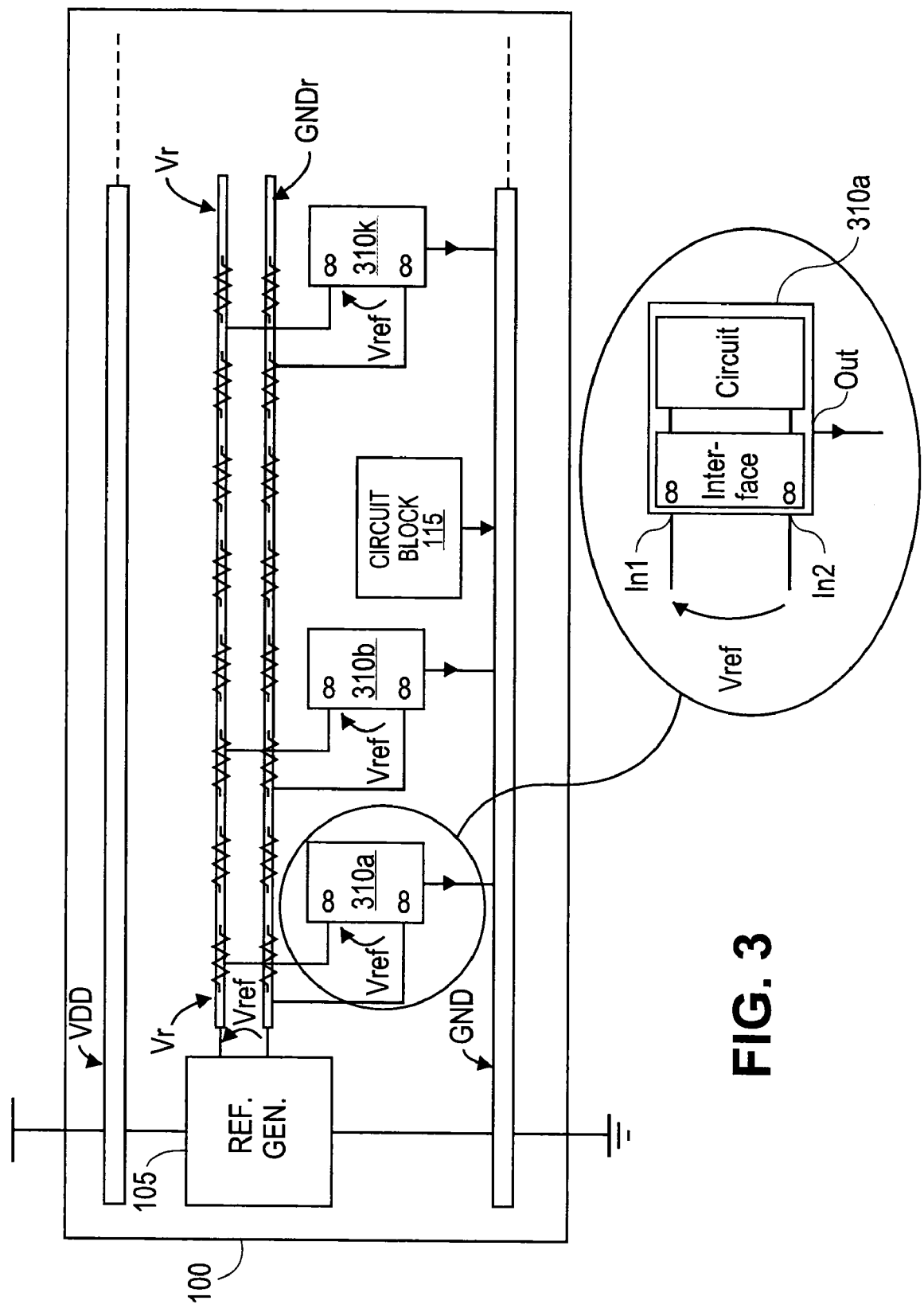
FIG. 3 schematically shows an IC with a reference voltage signal distribution scheme according to a first embodiment of the present invention.

With reference to the drawings, a reference electric quantity distribution scheme according to a first embodiment of the present invention is shown in FIG. 3, for generating and, particularly, distributing, through an electronic system, e.g., an IC chip 100, an electric quantity. In the example herein a voltage Vref is to be exploited as a reference voltage signal by one or more circuit blocks 310a, 310b, . . . , 310k in the IC.

Figure 2:
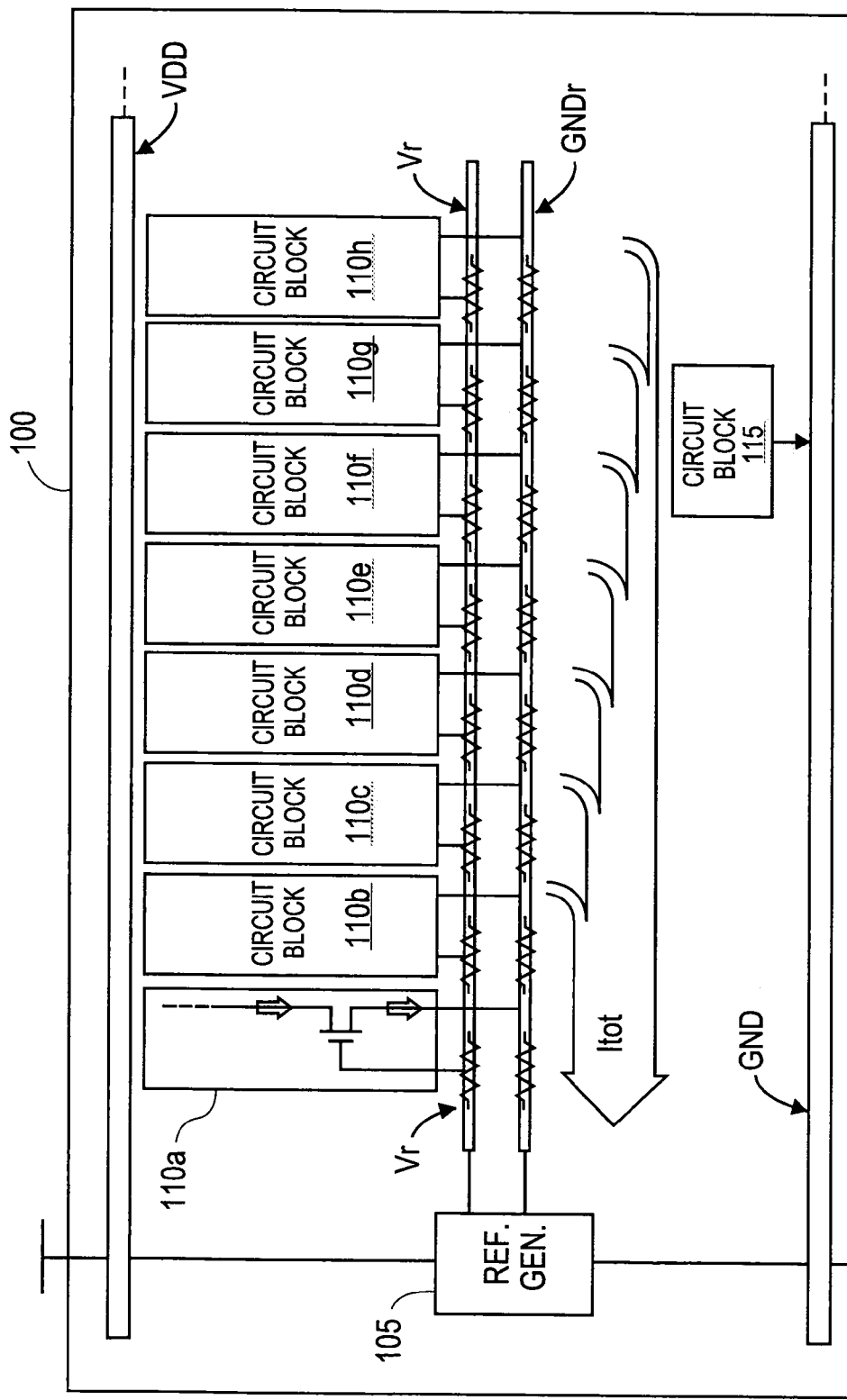
FIG. 2 schematically shows an IC wherein the reference voltage signal is distributed through the IC exploiting a dedicated reference electric potential metal, according to another known solution.

The reference voltage signal Vref is generated in a centralized way by a reference voltage signal generator 105, integrated in a localized region of the IC chip 100, and is distributed, through the IC chip 100, to the various circuit blocks 310a, 310b, . . . , 310k (remote from the generator 105), by means of a pair of distribution lines, typically 310a, 310b, . . . , 310k metal lines (metals) Vr and GNDr, the latter metal distributing a dedicated reference electric potential to which the reference voltage signal Vref is referred, in a way similar to that shown in FIG. 2.

In the sites of the IC chip 100 where the circuit blocks 310a, 310b, . . . , 310k are located, the reference voltage and the respective, dedicated reference electric potential are tapped off the metals Vr and GNDr, by means of respective conductive lines that are respectively fed to inputs In1, In2 of the relevant circuit block 310a, 310b, . . . , 310k.

As pictorially shown in the drawing, the inputs In1, In2 are such that they exhibit a very high, substantially infinite input impedance, thereby the inputs In1, In2 substantially do not sink any current from either the metal Vr or the metal GNDr. Additionally, the inputs In1, In2 are such that they do not inject any significant current into either the metal Vr or the metal GNDr. Any possible current that the generic circuit block 310a, 310b, . . . , 310k injects, is injected (as schematized by the circuit block output Out) into the common ground of the IC, distributed through the IC chip by the common ground metal GND.

In this way, essentially no current flows through the lines Vr and GNDr that distribute the reference voltage Vref through the IC chip 100, from the generation site 105 to the exploitation sites, at the circuit blocks 310a, 310b, . . . , 310k; in fact, due to the provision of a dedicated reference electric potential distribution line GNDr, the circuit blocks 115 of the IC other than those exploiting the reference voltage do not inject current into the line GNDr and thus do not disturb the value of the distributed reference voltage Vref, as in the solution discussed previously in connection with FIG. 2. In addition to this, according to an embodiment of the present invention, the fact that the inputs In1, In2 to the circuit blocks 310a, 310b, . . . , 310k, that are connected to the reference voltage distribution lines Vr and GNDr do not sink or inject currents from or into such lines ensures that substantially no current flows through the lines Vr and GNDr. Self-induced disturbs are thus also eliminated.

In other words, the circuit blocks 310a, 310b, . . . , 310k are designed in such a way as to have an input interface to the electric quantity (reference voltage) distribution arrangement (the metals Vr and GNDr, in the shown example) such that they do not perturb the distributed electric quantity.

Thus, despite the fact that the metals may have a non-negligible distributed resistance, the value of the reference voltage Vref does not substantially vary along the distribution path through the IC, remaining substantially the same as at the generation site.

It is not necessary to oversize the metals Vr, GNDr with the aim of reducing their resistivity so as to reduce possible disturbs of the value of the distributed voltage. The metals Vr, GNDr are in fact not intended to sustain any significant current flow, thereby they may be very narrow, even equal to the minimum feature size allowed by the technological process used for producing the IC.

Preferably, in order to eliminate possible noise on the reference voltage Vref induced by capacitive coupling with, e.g., fast-varying signals such as clock signals distributed through the IC chip 100, the metals Vr and GNDr that distribute the reference voltage Vr through the IC chip 100 are arranged such that the metal GNDr shields the metal Vr (e.g., the metal GNDr may actually consist of a pair of metals, running at both sides of the metal Vr), so that disturbs that are induced by capacitive coupling with the metals affect both the dedicated reference potential GNDr and the distributed reference voltage Vr, which can be considered a differential pair.

Figure 4:
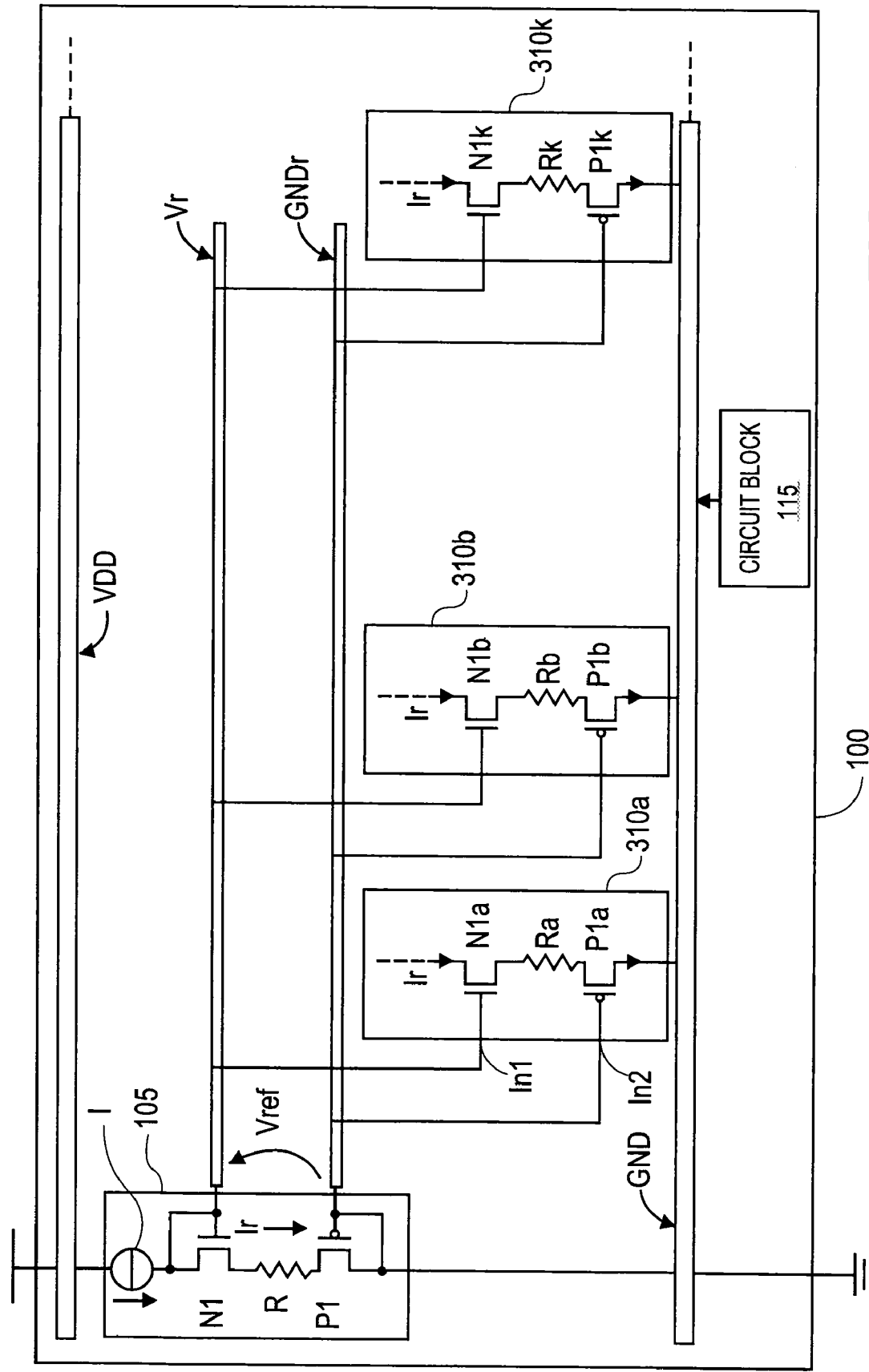
FIG. 4 schematically shows an IC with a reference voltage signal distribution scheme according to a second embodiment of the present invention.

In FIG. 4 an electric quantity generation and distribution scheme according to a second embodiment of the present invention is shown, for generating and distributing, through an electronic system, e.g., the IC chip 100, an electric quantity, in the example herein considered a voltage Vref. In this case, it is by way of example assumed that the reference voltage Vref that is distributed through the IC chip 100 is exploited, locally to the circuit blocks 310a, 310b, . . . , 310k, for deriving a reference current. The reference voltage generator 105 comprises for example a reference current generator I, generating a reference current Ir and injecting the reference current into a series connection of two transistors, particularly an N-channel MOSFET N1 and a P-channel MOSFET P1, both connected in diode configuration, with the respective gate electrode connected to the respective drain electrode. The (metal) distribution line Vr is connected to the gate of the MOSFET N1, whereas the (metal) distribution line GNDr is connected to the gate of the MOSFET P1.

The circuit blocks 310a, 310b, . . . , 310k include each an interface to the reference voltage distribution arrangement, such interface comprising a first and a second transistor, particularly an N-channel MOSFET N1a, N1b, . . . , N1k and a P-channel MOSFET P1a, P1b, . . . , P1k connected in series, with the gate of the N-channel MOSFET N1a, N1b, . . . , N1k connected to a conductor line tapped off the (metal) distribution line Vr, and the gate of the P-channel MOSFET P1a, P1b, . . . , P1k connected to a conductor line tapped off the (metal) distribution line GNDr. The P-channel MOSFET P1a, P1b, . . . , P1k has a drain electrode connected to the common ground potential distribution metal GND, while a drain electrode of the N-channel MOSFET N1a, N1b, . . . , N1k is the node delivering (sinking) the reconstructed reference current Ir (or, more generally, a current proportional to the reference current Ir) to the remaining circuit blocks 310a, 310b, . . . , 310k.

The MOSFETs N1a, N1b, . . . , N1k and P1a, P1b, . . . , P1k in the input interface of the generic circuit block 310a, 310b, . . . , 310k are in current-mirror configuration with the MOSFET N1 and P1, respectively, in the reference voltage generator 105. Thus, the input interface of the generic circuit block 310a, 310b, . . . , 310k is adapted to reconstruct, starting from the reference voltage Vref that is distributed through the IC chip 100, a current proportional, particularly equal to the reference current Ir.

It can be appreciated that the inputs In1 and In2 to the circuit blocks 310a, 310b, . . . , 310k are formed, in the example shown, by control electrodes of transistors, in particular gate electrodes of MOSFETs, i.e., they exhibit a very high input impedance, and neither sink nor inject any current from/into the distribution lines Vr and GNDr.

Figure 1:
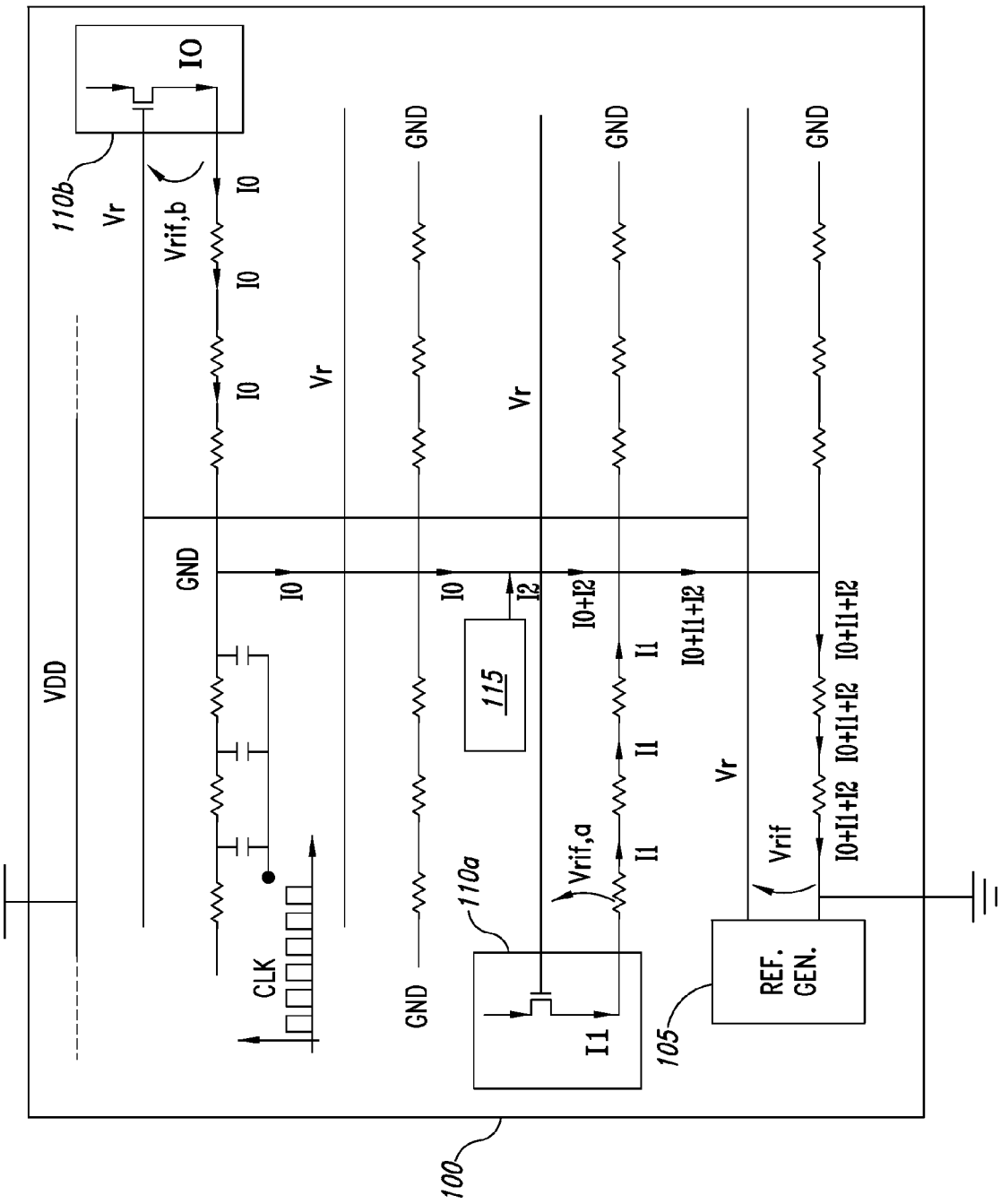
FIG. 1 schematically shows an IC wherein a reference voltage signal is distributed through the IC exploiting a common ground metal of the IC, according to a known solution.

Additionally, still considering the input interface of the generic circuit block 310a, 310b, . . . , 310k, the circuit node delivering (sinking) the reconstructed reference current Ir to the remaining circuitry of the generic circuit block 310a, 310b, . . . , 310k, is a drain electrode of an N-channel MOSFET; similarly, the circuit node from which the reconstructed reference current Ir is injected into the common ground metal GND is a drain electrode of a P-channel MOSFET. Both these circuit nodes exhibit a very high dynamic resistance, because the MOSFETs N1a, N1b, . . . , N1k and P1a, P1b, . . . , P1k operate in saturation. As a consequence, there is a strong rejection to disturbs on the value of the reconstructed reference current Ir caused by fluctuations of the common ground, either self-induced (i.e., induced by the currents injected by the circuit block 310a, 310b, . . . , 310k themselves) or induced by other circuit blocks 115 in the IC. On the contrary, in the known solutions discussed previously in connection with FIGS. 1 and 2, fluctuations on either the common ground (distributed by the metal GND) or on the dedicated ground (distributed by the metal GNDr) act directly as disturbs on the source electrode of a MOSFET.

Still referring to FIG. 4, it is observed that possible mismatches between the MOSFETs N1 and P1 in the reference generator 105 and the MOSFETs N1b, . . . , N1k and P1a, P1b, . . . , P1k in the circuit blocks 310a, 310b, . . . , 310k may cause slight deviations of the value of the reconstructed reference currents locally to the circuit blocks from the original, target reference current value Ir. Mismatches may for example affect the MOSFETs' threshold voltage, and are for example due to manufacturing process variations. In particular, mismatches are more probable the farther the circuit blocks 310a, 310b, . . . , 310k are from the reference generator 105, i.e., in the case of large IC chips. A possible way to alleviate the effect of mismatches is to introduce a source electrode degeneration, for example by providing resistors R, Ra, Rb, . . . , Rk between the MOSFETs N1 and P1, N1a and P1a, N1b and P1b, . . . , N1k and P1k. The provision of the resistors R, Ra, Rb, . . . , Rk introduces a negative feedback that reduces the effect of mismatches between the MOSFETs.

Figure 5:
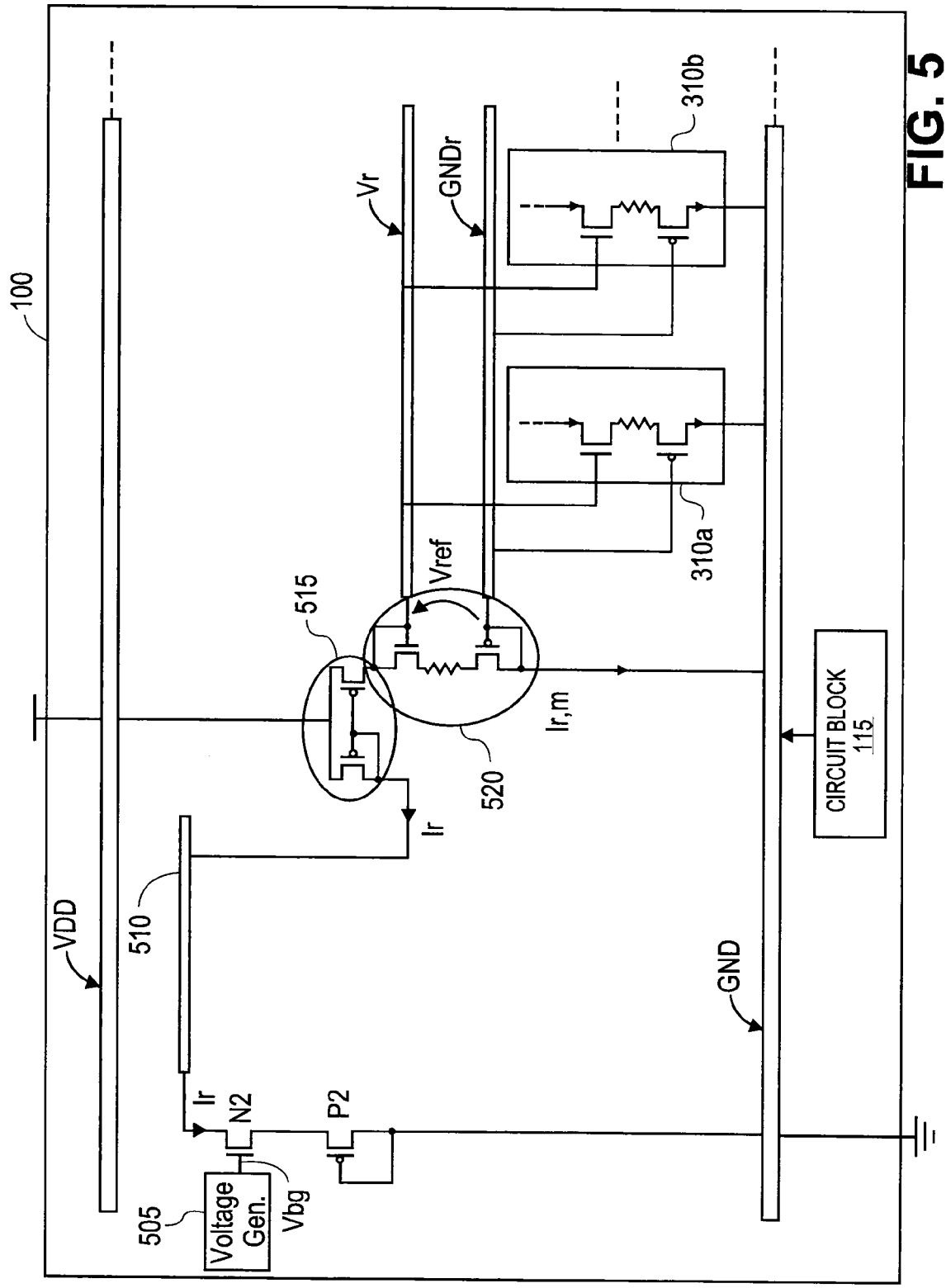
FIG. 5 schematically shows an IC with a reference voltage distribution scheme according to a third embodiment of the present invention.

FIG. 5 schematically shows an electric quantity generation and distribution scheme according to a third embodiment of the present invention, adapted in particular in the case the electric quantity has to be distributed through large IC chips.

At a first, centralized location in the IC chip 100, a reference voltage, e.g., a bandgap reference voltage Vbg generated by a bandgap reference voltage generator 505 is converted into a reference current Ir by applying the bandgap voltage Vbg to the gate of an N-channel MOSFET N2, connected in series to a load element, e.g., a P-channel MOSFET P2 in diode configuration and with the drain electrode connected to the common ground.

The reference current Ir obtained by conversion of the bandgap voltage Vbg is distributed through the IC chip 100 by means of a distribution line (a metal) 510.

At a second location in the IC chip 100, relatively remote from the first location where it is generated by conversion, the reference current Ir is exploited to obtain, by reconversion into a voltage signal, a reference voltage Vref. To this purpose, the reference current Ir, distributed through the metal 510, is supplied into an input branch of a current mirror 515 (made of P-channel MOSFETs, in the shown example), and the output branch of the current mirror is connected to a circuit arrangement 520 equivalent to the reference generator 105 in the embodiment of FIG. 4, i.e., a series connection of N-channel and P-channel MOSFETs, in the example considered. The mirrored current Ir,m (proportional, in particular equal to the reference current Ir) is thus converted into a reference voltage Vref that, similarly to the embodiment of FIG. 4, is distributed, locally, to a plurality of circuit blocks 310a, 310b, . . . exploiting the reference voltage Vref.

In other words, instead of distributing through the chip 100 directly the reference voltage Vref, a current, obtained for example by conversion from a starting reference voltage Vbg, is distributed and, in the regions of the IC chip where there are clusters of circuit blocks 310a, 310b, . . . needing the reference voltage, the current is reconverted into the reference voltage Vref and distributed to the various circuit blocks of the cluster, in a way similar to that described in FIG. 4, i.e., ensuring that the circuit blocks 310a, 310b, . . . have input interfaces not perturbing the values of the distributed potentials. Due to this arrangement, the effects of component mismatches are reduced, because even if the chip is rather large, the reference voltage Vref is distributed as such only locally, where clusters of circuit blocks needing the reference voltage are located, over a relatively short distance, and the mutual vicinity of the components ensures that they have essentially similar characteristics.

Although the present invention has been disclosed and described by way of some embodiments, it is apparent to those skilled in the art that several modifications to the described embodiments, as well as other embodiments of the present invention are possible without departing from the scope thereof as defined in the appended claims.

For example, other types of transistors can be used in the input interfaces of the circuit blocks locally exploiting the distributed electric quantity, in place of MOSFETs.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A method of distributing a reference voltage signal through an integrated circuit (IC) including a plurality of circuit blocks, comprising:
   generating the reference voltage signal; and
   distributing, to the plurality of circuit blocks, the reference voltage signal with a reference voltage line at a reference voltage potential relative to a reference ground line, wherein the reference ground line is coupled to a common ground line at a first node and is further coupled to a gate of a first P-channel transistor in each of the plurality of circuit blocks, the first P-channel transistor having a drain coupled to the common ground line at a second node, wherein the reference voltage line is coupled to a first N-channel transistor gate of each of the plurality of circuit blocks, the first N-channel transistor having a source coupled in series to a source of the first P-channel transistor to form an input interface for each of the plurality of circuit blocks.

2. The method as in claim 1, further comprising operating both the first P-channel and first N-channel transistors of each input interface in saturation.

3. The method as in claim 1, wherein generating the reference voltage signal further comprises injecting a reference current into a second N-channel transistor and a second P-channel transistor, each in a diode configuration and connected with sources in series, and with the second P-channel transistor having a drain coupled to the common ground; and
wherein distributing the reference voltage signal further comprises setting the reference voltage line potential to the voltage of the second N-channel gate electrode and setting the reference ground line potential to the voltage of the second P-channel gate electrode.

4. The method as in claim 1, further comprising:
reconstructing the reference voltage signal distributed to each circuit block by coupling a remaining circuitry within each circuit block to the drain of the first N-channel transistor.

5. The method as in claim 1, further comprising:
operating the first N-channel and first P-channel transistors with source electrode degeneration.

6. The method as in claim 5, further comprising:
coupling a degenerated resistor between the first N-channel transistor and the first P-channel transistor.

7. The method as in claim 3, wherein the reference voltage line is dedicated to the first and second N-channel gate electrode connections and wherein the ground reference line is dedicated to the first and second P-channel gate electrode connections.

8. An integrated circuit (IC) comprising:
a reference voltage signal generator;
a plurality of circuit blocks, each of the plurality of circuit blocks including a first P-channel transistor having a drain coupled to a common ground line at a first node;
a reference voltage line coupled to each of the plurality of circuit blocks; and a reference ground line coupled to the common ground line at a second node and further coupled to a gate of the first P-channel transistor in each of the plurality of circuit blocks, wherein the reference voltage line is coupled to a gate of a first N-channel transistor in each of the plurality of circuit blocks, the first N-channel transistor having a source coupled in series to a source of the first P-channel transistor in each circuit block to form an input interface for each of the plurality of circuit blocks.

9. The IC as in claim 8, wherein reference voltage signal generator further comprises:
a second N-channel transistor and a second P-channel transistor, each transistor in a diode configuration and with sources connected in series, with the second N-channel transistor coupled to a current source and the second P-channel transistor drain coupled to the common ground;
a gate electrode of the second N-channel transistor further coupled to the reference voltage line; and
a gate electrode of the second P-channel transistor further coupled to the reference ground line.

10. The IC as in claim 8, further comprising:
a remaining circuitry in each of the circuit blocks, the remaining circuitry coupled to the drain of the first N-channel transistor.

11. The IC as in claim 8, further comprising:
a degenerated resistor between the first N-channel transistor and the first P-channel transistor.

12. The IC as in claim 9, wherein the reference voltage line is dedicated to the first and second N-channel gate electrode connections and wherein the ground reference line is dedicated to the first and second P-channel gate electrode connections.

13. The IC as in claim 9, wherein the IC is a non-volatile memory circuit and each circuit block includes a memory cell.

14. A non-volatile memory circuit comprising:
a reference voltage signal generator;
a plurality of memory cells, each of the plurality of memory cells coupled to a reference voltage input interface including a first P-channel transistor having a drain coupled to a common ground line at a first node;
a reference voltage line coupled to each of the plurality of reference voltage input interfaces; and
a reference ground line coupled to the common ground line at a second node and further coupled to a gate of the first P-channel transistor of each of the reference voltage input interfaces, wherein the reference voltage line is coupled to a first N-channel transistor gate of each of the reference voltage input interfaces, the first N-channel transistor being coupled in series to the first P-channel transistor.

15. The non-volatile memory circuit as in claim 14, wherein reference voltage signal generator further comprises:
a second N-channel transistor and a second P-channel transistor, each transistor a diode configuration and with sources connected in series, with the second N-channel transistor coupled to a current source and the second P-channel transistor drain coupled to the common ground;
a gate electrode of the second N-channel transistor further coupled to the reference voltage line; and
a gate electrode of the second P-channel transistor further coupled to the reference ground line.

16. The non-volatile memory circuit as in claim 14, further comprising:
a flash memory device in each of the memory cells, the flash memory device coupled to the drain of the first N-channel transistor.

17. The IC as in claim 14, further comprising:
a degenerated resistor between the first N-channel transistor and the first P-channel transistor of each reference voltage input interface.

* * * * *